US012586615B2

(12) United States Patent
Yun et al.

(10) Patent No.: US 12,586,615 B2
(45) Date of Patent: Mar. 24, 2026

(54) CONTROLLER, STORAGE DEVICE AND METHOD FOR OPERATING STORAGE DEVICE

(71) Applicant: SK hynix Inc., Icheon-si (KR)

(72) Inventors: Sang Ho Yun, Icheon-si (KR); Hyuk Min Kwon, Icheon-si (KR); Nam Kyeong Kim, Icheon-si (KR); Dae Sung Kim, Icheon-si (KR); Jeong Myung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 141 days.

(21) Appl. No.: 18/463,678

(22) Filed: Sep. 8, 2023

(65) Prior Publication Data

US 2024/0355370 A1 Oct. 24, 2024

(51) Int. Cl.
*G11C 7/10* (2006.01)
*G11C 29/52* (2006.01)

(52) U.S. Cl.
CPC .......... *G11C 7/1069* (2013.01); *G11C 7/1057* (2013.01); *G11C 29/52* (2013.01)

(58) Field of Classification Search
CPC ..... G11C 7/1069; G11C 7/1057; G11C 29/52; G11C 29/021; G11C 29/028; G06F 3/061; G06F 3/0604; G06F 3/0658; G06F 2212/1016
USPC .................................................. 365/189.011
See application file for complete search history.

(56) References Cited

U.S. PATENT DOCUMENTS

| | | | | |
|---|---|---|---|---|
| 6,014,764 A * | 1/2000 | Graeve | ............ | G01R 31/31921 |
| | | | | 714/738 |
| 2015/0135032 A1* | 5/2015 | Alhussien | .............. | G11C 29/42 |
| | | | | 714/758 |
| 2020/0183592 A1* | 6/2020 | Lim | ........................ | G11C 16/26 |

FOREIGN PATENT DOCUMENTS

| | | | |
|---|---|---|---|
| KR | 10-2021-0024912 A | 3/2021 |
| KR | 10-2021-0105096 A | 8/2021 |
| KR | 10-2021-0146637 A | 12/2021 |

* cited by examiner

*Primary Examiner* — Huan Hoang

(57) ABSTRACT

A read pattern obtained in a read operation for determining an optimal read voltage when an initial read operation fails is stored, and is used in a read operation to be subsequently performed for determining a new optimal read voltage.

18 Claims, 10 Drawing Sheets

CONTROLLER, STORAGE DEVICE AND METHOD FOR OPERATING STORAGE DEVICE

CROSS-REFERENCE TO RELATED APPLICATION

The present application claims priority under 35 U.S.C. § 119(a) to Korean Patent Application No. 10-2023-0051728 filed in the Korean Intellectual Property Office on Apr. 20, 2023, which is incorporated herein by reference in its entirety.

BACKGROUND

1. Technical Field

Various embodiments generally relate to a controller, a storage device and a method for operating a storage device.

2. Related Art

A storage device may include a memory, which includes a plurality of memory cells. The storage device may include a controller that controls the operation of the memory. For example, the controller may control data program, read and erase operations on the memory.

When a read operation on the memory is performed, a preset read voltage may be supplied to the memory cells. As the memory cells degrade, threshold voltages of transistors included in the memory cells may change. Due to the changes in the threshold voltages of the transistors, read operations using a preset read voltage may fail.

When a read operation fails, an operation for determining a new optimal read voltage may be performed. In such instances, however, performance of the storage device may degrade due to an increase in the number of read operations.

SUMMARY

Various embodiments are directed to providing measures capable of determining an optimal read voltage while reducing the number of read operations for memory cells when a read operation on a memory fails.

In an embodiment, a storage device may include: a memory including a plurality of memory cells; and a controller configured to determine at least two first optimal read voltages by performing a first read operation on at least a part of the plurality of memory cells, to store at least two read patterns obtained through the first read operation, and to identify at least two second optimal read voltages obtained through a second read operation different from the first read operation, by using the at least two read patterns.

In an embodiment, a method for operating a storage device may include: determining at least two first optimal read voltages for at least a part of a plurality of memory cells by performing a first read operation; storing at least two read patterns obtained through the first read operation; determining at least two second optimal read voltages by performing a second read operation different from the first read operation; and identifying the at least two second optimal read voltages using the at least two read patterns.

In an embodiment, a controller may include: a buffer memory; and a processor configured to determine at least two first optimal read voltages by performing a first read operation, to store at least two read patterns obtained through the first read operation in the buffer memory, and to identify at least two second optimal read voltages determined through a second read operation different from the first read operation, by using the at least two read patterns.

According to the embodiments of the disclosed technology, since an optimal read voltage may be determined while reducing the number of read operations additionally performed when a read operation on a memory fails, efficiency of a read operation on the memory may be improved.

DETAILED DESCRIPTION

Figure 1:
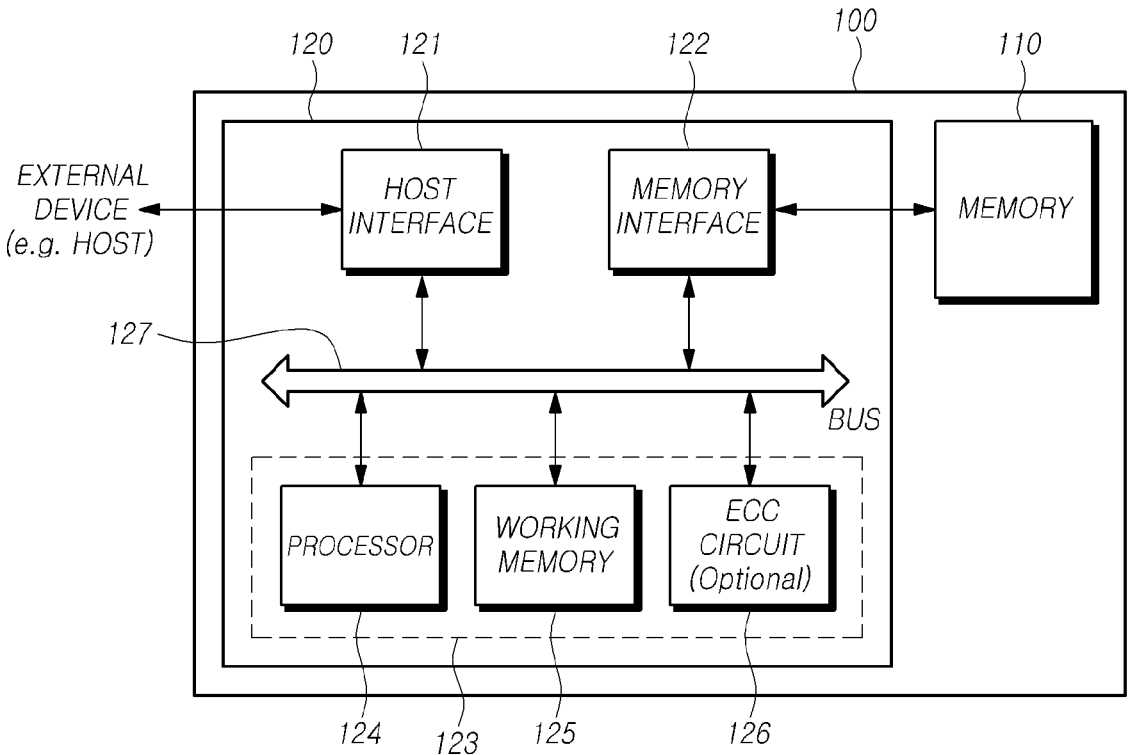
FIG. 1 is a diagram illustrating a schematic configuration of a storage device according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a diagram illustrating a schematic configuration of a storage device according to an embodiment of the present disclosure.

Referring to FIG. 1, a storage device 100 may include a memory 110 that stores data, and a controller 120 that controls the memory 110.

The memory 110 may include a plurality of memory blocks, and may operate in response to the control of the controller 120. Operations of the memory 110 may include, for example, a read operation, a program operation (also referred to as a write operation) and an erase operation.

The memory 110 may include a memory cell array including a plurality of memory cells (referred to as "cells") that store data. Such a memory cell array may exist in a memory block.

For example, the memory 110 may be implemented into various types such as a NAND flash memory, a 3D NAND flash memory, a NOR flash memory, a resistive random access memory (RRAM), a phase-change random access memory (PRAM), a magnetoresistive random access memory (MRAM), a ferroelectric random access memory (FRAM) and a spin transfer torque random access memory (STT-RAM).

The memory 110 may be implemented into a three-dimensional array structure. Embodiments of the disclosed technology may be applied to not only a flash memory in which a charge storage layer is configured by a conductive floating gate but also a charge trap flash (CTF) in which a charge storage layer is configured by a dielectric layer.

The memory 110 may receive a command and an address from the controller 120 and may access an area that is selected by the address in the memory cell array. The memory 110 may perform an operation instructed by the command, on the area selected by the address.

For example, the memory 110 may perform a program operation, a read operation and an erase operation.

When performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, the background operation may include at least one among a garbage collection (GC) operation, a wear-leveling (WL) operation, a read reclaim (RR) operation, a bad block management (BBM) operation, and so forth.

The controller 120 may control the operation of the memory 110 according to a request from a device (e.g., a host) located outside the storage device 100. Also, the controller 120 may control the operation of the memory 110 regardless of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, a mobility device (e.g., a vehicle, a robot or a drone) capable of driving under human control or autonomous driving, etc. Alternatively, the host may be a virtual/augmented reality device that provides a 2D or 3D virtual reality image or augmented reality image. In addition, the host may be any one of various electronic devices that require the storage device 100, which is capable of storing data.

The host may include at least one operating system. The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other. the controller 120 and the host may also be implemented by being integrated into one device. Hereunder, for the sake of convenience in explanation, it will be described as an example that the controller 120 and the host are devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface which uses at least one among various interface protocols such as a USB (Universal Serial Bus) protocol, an MMC (multimedia card) protocol, a PCI (Peripheral Component Interconnection) protocol, a PCI-E (PCI-express) protocol, an ATA (Advanced Technology Attachment) protocol, a serial-ATA protocol, a parallel-ATA protocol, an SCSI (Small Computer System Interface) protocol, an ESDI (Enhanced Small Disk Interface) protocol, an IDE (Integrated Drive Electronics) protocol, an SMBus (System Management Bus) protocol, an I2C (Inter-Integrated Circuit) protocol, an I3C (Improved Inter-Integrated Circuit) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110.

The memory interface 122 may be configured to provide an interface between the memory 110 and the controller 120 in response to the control of the control circuit 123.

The control circuit 123 performs the general control operation of the controller 120 to control the operation of the memory 110. To this end, for instance, the control circuit 123 may include at least one of a processor 124 and a working memory 125, and may selectively include an error detection and correction circuit (ECC circuit) 126.

The processor 124 may control the general operation of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate it into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host, by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110, by using a derandomizing seed. The derandomized data may be outputted to the host.

The processor 124 may execute firmware to control the operation of the controller 120. In order to control the general operation of the controller 120 and perform a logic calculation, the processor 124 may execute (drive) firmware loaded in the working memory 125 upon booting. Hereafter, an operation of the storage device 100 to be described based on an embodiment of the disclosed technology may be implemented in such a way that the processor 124 executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one among a flash translation layer (FTL), which performs a translating function between a logical address requested to the storage device 100 from the host and a physical address of the memory 110; a host interface layer (HIL), which serves to analyze a command requested to the storage device 100 from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 to generate a command or a signal, according to a result of performing the logic calculation defined in the firmware. When a part of firmware in which a logic calculation to be performed is defined is not loaded in the working memory 125, the processor 124 may generate an event (e.g., an interrupt) for loading the corresponding part of the firmware in the working memory 125.

The processor 124 may load metadata necessary for driving firmware, from the memory 110. The metadata, as data for managing the memory 110, may include management information on user data stored in the memory 110.

Firmware may be updated while the storage device 100 is manufactured or while the storage device 100 is executed. The controller 120 may download new firmware from the outside of the storage device 100 and update existing firmware with the new firmware.

The working memory 125 may store firmware, a program code, a command and data, which are necessary to drive the controller 120. Such a working memory 125 as, for example, a volatile memory may include at least one among an SRAM (static RAM), a DRAM (dynamic RAM) and an SDRAM (synchronous DRAM).

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be incorporated into one component. In addition to the above-described components 121, 122, 124, 125 and 126 of the controller 120, one or more other components may be added.

Hereinbelow, the memory 110 will be described in further detail with reference to FIG. 2.

Figure 2:
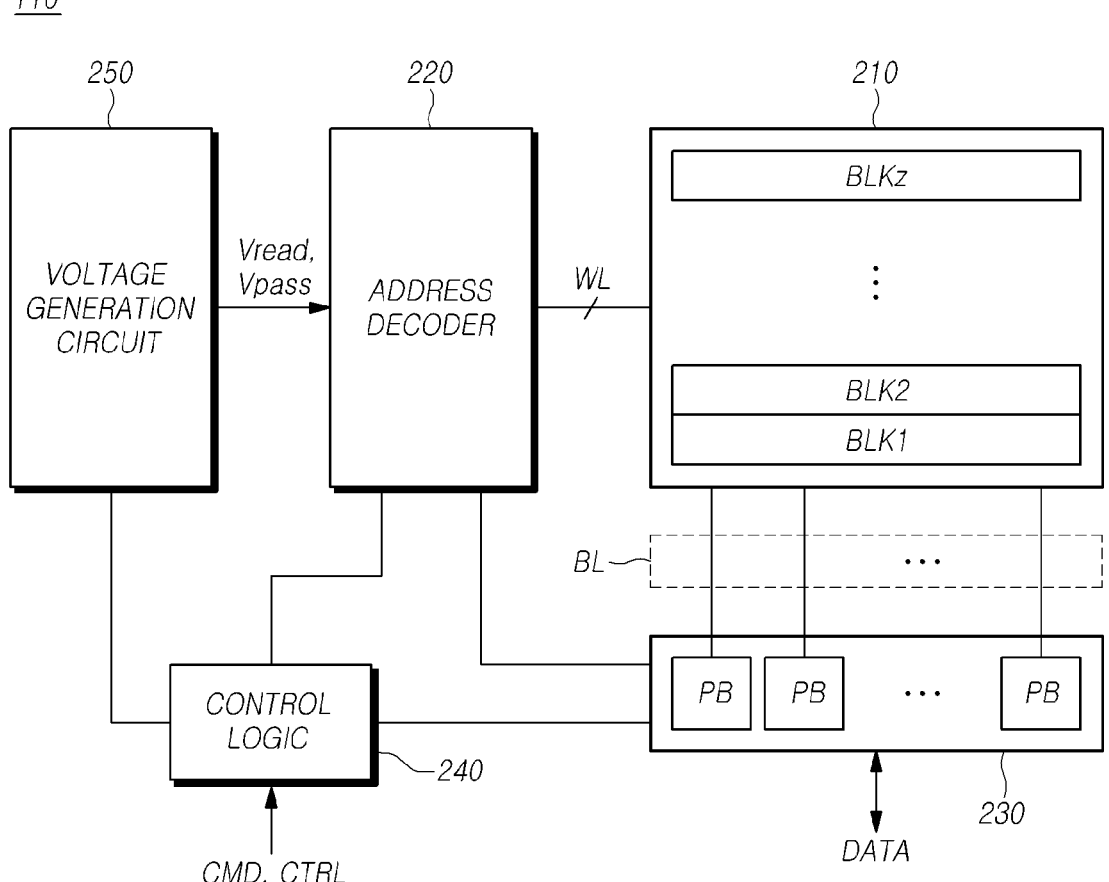
FIG. 2 is a diagram illustrating a schematic configuration of a memory included in a storage device according to an embodiment of the present disclosure.

FIG. 2 is a diagram illustrating a schematic configuration of a memory included in a storage device according to an embodiment of the present disclosure.

Referring to FIG. 2, a memory 110 may include a memory cell array 210, an address decoder 220, a read and write circuit 230, a control logic 240 and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells (MC). For example, the plurality of memory cells (MC) may be nonvolatile memory cells, and may be configured by nonvolatile memory cells that have vertical channel structures.

The memory cell array 210 may be configured by a memory cell array of a two-dimensional structure, or as the case may be, may be configured by a memory cell array of a three-dimensional structure.

Each of the plurality of memory cells (MC) included in the memory cell array 210 may store data of at least 1 bit. For instance, each of the plurality of memory cells (MC) included in the memory cell array 210 may be a signal level cell (SLC) which stores 1-bit data. In another instance, each of the plurality of memory cells (MC) included in the memory cell array 210 may be a multi-level cell (MLC) that stores 2-bit data, a triple-level cell (TLC) that stores 3-bit data or a quad-level cell (QLC) that stores 4-bit data.

The number of bits of data stored in each of the plurality of memory cells (MC) may be dynamically determined. For example, a single-level cell that stores 1-bit data may be changed to a triple-level cell that stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL. The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block according to the decoded block address.

The address decoder 220 may receive a read voltage Vread and a pass voltage Vpass from the voltage generation circuit 250.

In a read voltage applying operation during a read operation, the address decoder 220 may apply the read voltage Vread to a selected word line WL in a selected memory block, and may apply the pass voltage Vpass to the remaining unselected word lines WL.

In a program verify operation, the address decoder 220 may apply a verify voltage generated in the voltage generation circuit 250 to a selected word line WL in a selected memory block, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line WL depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 may also be referred to as a page buffer circuit, which includes a plurality of page buffers PB or a data register circuit. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data to the input/output buffer of the memory 110. As an exemplary embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. In another example, each of the plurality of word lines WL may be disposed in a column direction, and each of the plurality of bit lines BL may be disposed in a row direction.

A memory cell, which is coupled to one of the plurality of word lines WL and one of the plurality of bit lines BL, may be defined. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

A read operation and a program operation (write operation) of the memory block described above may be performed by the unit of a page, and an erase operation may be performed by the unit of a memory block.

Read operations using a preset read voltage may fail due to the degradation of transistors disposed in the memory cells (MC) of the memory 110. In such cases, a read operation may be performed again by determining an optimal read voltage.

Figure 3:
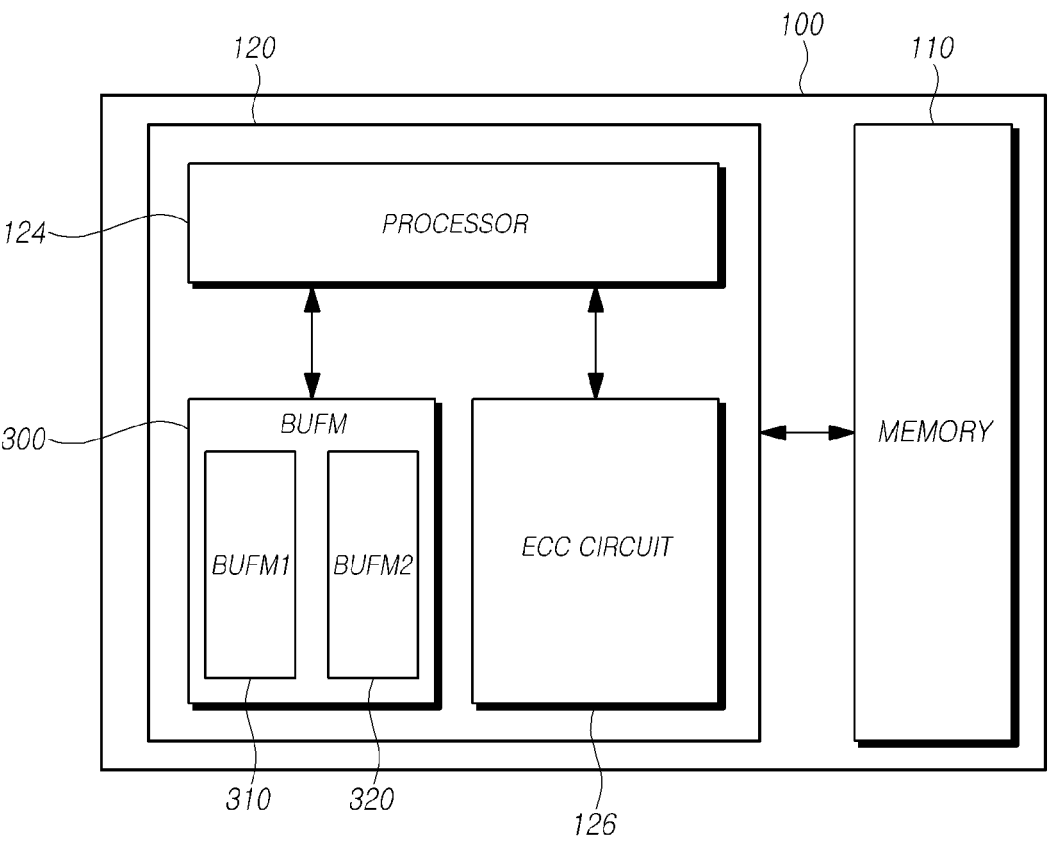
FIG. 3 is a diagram illustrating an example of a configuration used to determine an optimal read voltage in a storage device according to an embodiment of the present disclosure.

FIG. 3 is a diagram illustrating an example of a configuration used to determine an optimal read voltage in a storage device according to an embodiment of the present disclosure.

Referring to FIG. 3, a storage device 100 may include a memory 110, which includes a plurality of memory cells, and a controller 120, which controls the operation of the memory 110.

The controller 120 may include, for example, a processor 124, an error detection and correction circuit 126 and a buffer memory (BUFM) 300. The controller 120 may include at least one buffer memory 300. FIG. 3 shows an example in which the controller 120 includes a first buffer memory (BUFM1) 310 and a second buffer memory (BUFM2) 320.

The buffer memory 300 may be the aforementioned working memory 125, or may be a memory that is disposed separately from the working memory 125.

The processor 124 may control a read operation for memory cells included in the memory 110 according to a read command. The processor 124 may perform a read operation using a preset read voltage.

For example, when the read operation using the preset read voltage succeeds, the processor 124 may transmit read data to the outside.

When the read operation using the preset read voltage fails, the error detection and correction circuit 126 may perform an error correction operation. For example, the error detection and correction circuit 126 may detect an error bit of target data and correct the detected error bit, by using an error correction code. The target data may be data stored in the working memory 125 or the buffer memory 300, or may be data read from the memory 110.

The error detection and correction circuit 126 may be implemented to decode data using an error correction code. The error detection and correction circuit 126 may be implemented by various code decoders. For example, a decoder that performs unsystematic code decoding or a decoder that performs systematic code decoding may be used.

The error detection and correction circuit 126 may detect an error bit by the unit of a set sector for each of the read data. Each read data may be constituted by a plurality of sectors. A sector may mean a data unit smaller than a page, which is the read unit of a flash memory. Sectors constituting each read data may be matched with one another through an address.

The error detection and correction circuit 126 may calculate a bit error rate (BER), and may determine whether an error is correctable or not, by the unit of a sector. For example, when a bit error rate is lower than a reference value, the error detection and correction circuit 126 may determine that a corresponding sector is correctable or a pass. When read data is recovered according to the error correction operation by the error detection and correction circuit 126, the processor 124 may transmit recovered data to the outside.

When a bit error rate is higher than the reference value, the error detection and correction circuit 126 may determine that a corresponding sector is uncorrectable or a fail.

The error detection and correction circuit 126 may perform an error detection and correction operation sequentially for all read data. When a sector included in read data is correctable, the error detection and correction circuit 126 may omit an error detection and correction operation for a corresponding sector for the next read data.

When the error detection and correction operation for all read data is ended, the error detection and correction circuit 126 may detect a sector, which is determined to be uncorrectable, last. There may be one or more sectors that are determined to be uncorrectable. The error detection and correction circuit 126 may transfer information (e.g., address information) on a sector that is determined to be uncorrectable, to the processor 124.

When read data is not recovered by the error correction operation by the error detection and correction circuit 126, the processor 124 may perform a read operation again using a new read voltage.

For example, the processor 124 may perform a read operation again using a history read voltage used when a read operation previously succeeded.

The history read voltage may mean a read voltage used in the most recently successful read operation, among previous read operations, for a memory block corresponding to a read command.

A history read operation may be performed according to the level of the read voltage used in the most recently successful read operation. Memory blocks may have history read voltages of different levels. The level of the history read voltage corresponding to each memory block may be stored in the working memory 125, which is located inside the controller 120, or in the memory 110, which is located outside the controller 120.

The processor 124 may determine whether a read operation, using the history read voltage, has succeeded. For example, when error correction is possible by performing decoding for read data by the error detection and correction circuit 126, the processor 124 may determine that a read operation using a history read voltage has succeeded.

When the read operation using a history read voltage succeeds, the processor 124 may transmit the read data to the outside.

When error correction is not possible, the processor 124 may determine that the read operation with the history read voltage has failed.

When the read operation with the history read voltage fails, the processor 124 may perform a read operation again using at least one of a plurality of read retry voltages, which are set in a read retry table.

The processor 124 may perform another read operation on data programmed in a memory block corresponding to a read command, using a read retry voltage having a level that is different from the level of the history read voltage. The read retry voltage can be selected from among the plurality of read retry voltages set in the read retry table.

By performing decoding with the error detection and correction circuit 126, the processor 124 may determine whether error correction is possible. When the read operation using the read retry voltage succeeds, the processor 124 may transmit read data to the outside.

When the read operation using the history read voltage or the read retry voltage fails, the processor 124 may perform read operations using various read voltages, and may perform operations for determining optimal read voltages.

For example, the processor 124 may perform a first read operation and determine a first optimal read voltage. The first read operation may be, for example, a read operation performed on the basis of Gaussian modeling.

The processor 124 may perform a read operation on the basis of a peak read voltage corresponding to a peak in a threshold voltage distribution according to Gaussian modeling. The processor 124 may perform the read operation using the peak read voltage, or may perform a read operation using a read voltage corresponding to the middle value of the peak read voltage.

In a read operation based on the peak read voltage, the processor 124 may perform, for example, a read operation on a least significant bit read page and a read operation on a most significant bit read page. In some instances, the processor 124 may perform a read operation on a middle bit read page.

The processor 124 may obtain a least significant bit read pattern, a most significant bit read pattern and a middle bit read pattern through the read operations on the least significant bit read page, the most significant bit read page and the middle bit read page.

The processor 124 may store a read pattern including the least significant bit read pattern, the most significant bit read pattern and the middle bit read pattern in the buffer memory 300. For example, the processor 124 may store the read pattern in the first buffer memory 310. The read pattern may be maintained in the first buffer memory 310 until a read operation by the processor 124 succeeds.

When a space for storing a read pattern is insufficient in the first buffer memory 310, the read pattern may be stored in the second buffer memory 320. The read pattern obtained through the first read operation may be stored in at least one of the first buffer memory 310 and the second buffer memory 320 during a period in which the read operation for determining an optimal read voltage is performed after the failure of a read operation.

The processor 124 may determine the middle value of the peak read voltage used in the first read operation as the first optimal read voltage. The processor 124 may perform a read operation again using the first optimal read voltage.

When the read operation using the first optimal read voltage fails, the processor 124 may perform a second read operation for determining a new optimal read voltage. For example, the processor 124 may perform the second read operation using at least two candidate read voltages, which are increases in units of a predetermined offset within a range adjacent to the first optimal read voltage.

The processor 124 may determine a second optimal read voltage while performing the second read operation using the at least two candidate read voltages.

The processor 124 may use the read pattern stored in the buffer memory 300 in the process of determining and identifying the second optimal read voltage. The processor 124 may determine that the second optimal read voltage determined using the read pattern is a read voltage identifying the data stored in a memory cell.

In embodiments of the disclosure, however, a separate read operation may not be required to identify the second optimal read voltage. An optimal read voltage may be determined while reducing the number of read operations.

When a read operation by the second optimal read voltage succeeds, the processor 124 may delete the read pattern stored in the buffer memory 300.

When the read operation by the second optimal read voltage fails, the processor 124 may perform an operation for determining an additional read voltage. The read pattern stored in the buffer memory 300 is not deleted so that it can be used in performing the operation for determining an additional read voltage.

Since the processor 124 stores and manages the read pattern, which is obtained during the first read operation, in the buffer memory 300, the number of read operations additionally performed in the process of subsequently determining a new optimal read voltage may be reduced, and efficiency of a read operation may be increased.

The scheme of using the read pattern, obtained through the first read operation, during the second read operation subsequently performed may be applied to all cases where a memory cell is not a single-level cell.

Figure 4:
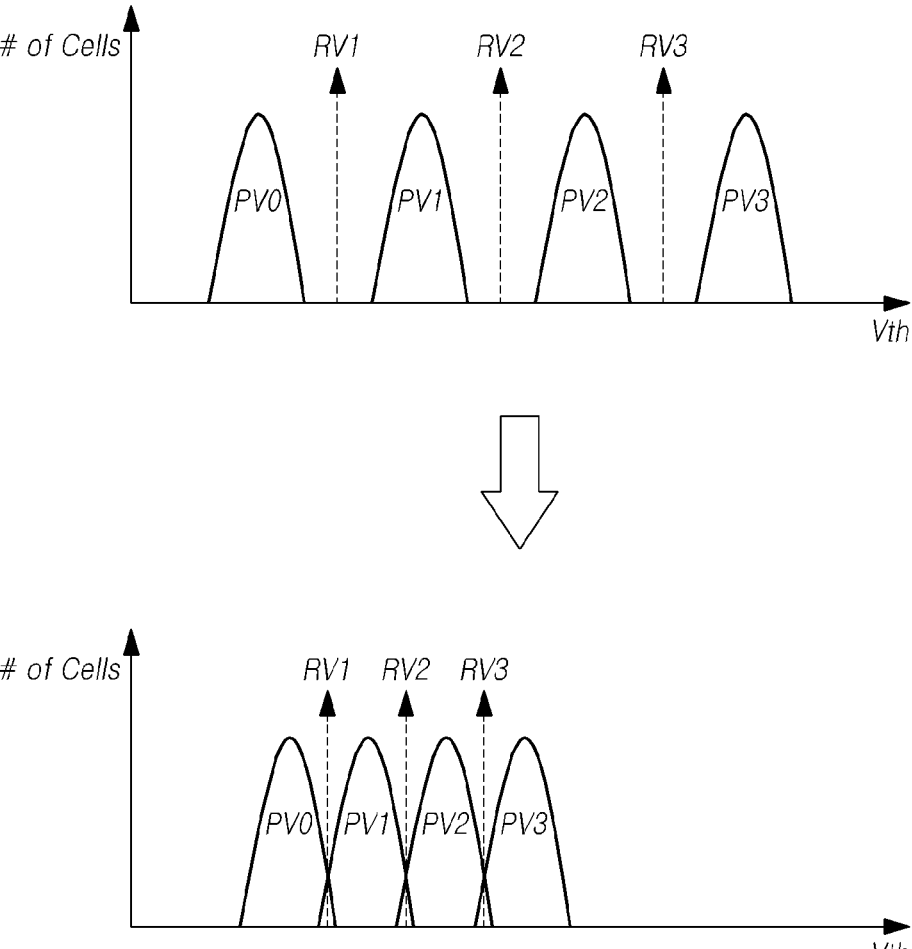
FIGS. 4 to 6 are diagrams illustrating examples in which read operations are performed when memory cells of a memory included in a storage device are multi-level cells, according to an embodiment of the present disclosure.
Figure 5:
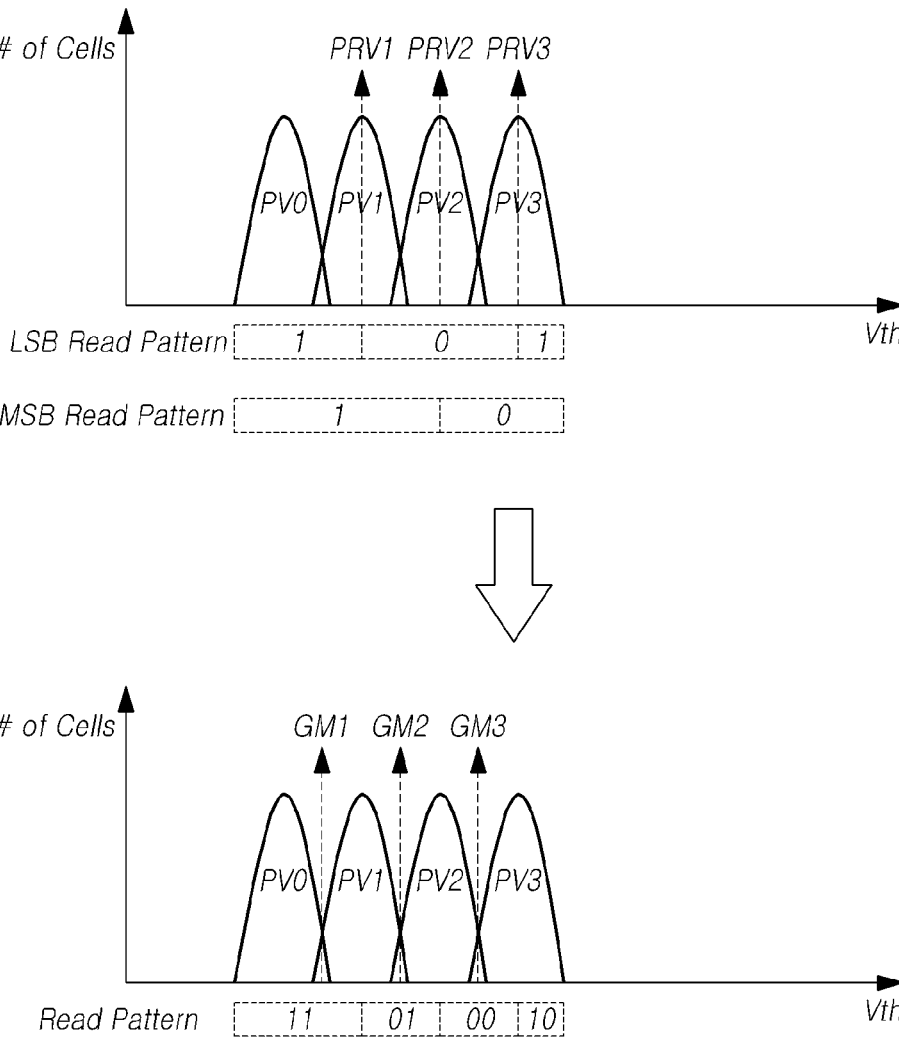
Figure 6:
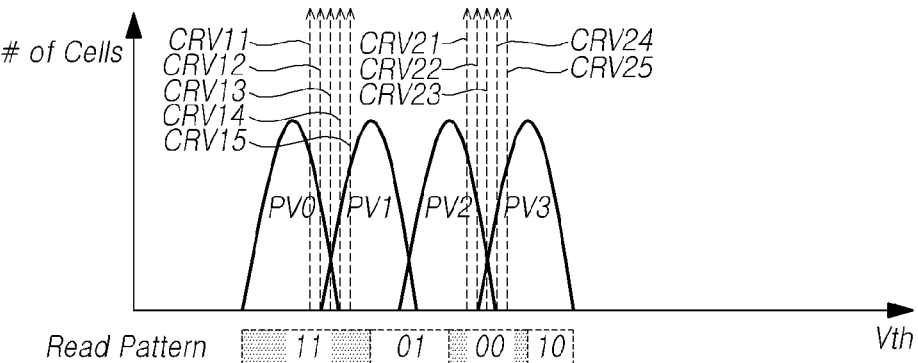

FIGS. 4 to 6 are diagrams illustrating examples in which read operations are performed when memory cells of a memory included in a storage device are multi-level cells, according to an embodiment of the present disclosure.

Referring to FIG. 4, a read operation performed using threshold voltage distributions PV0 to PV3 of memory cells and preset read voltages RV1, RV2 and RV3 are illustrated as an example.

For example, the threshold voltage distribution PV0 may represent the threshold voltage distribution of memory cells whose stored data is "11." The threshold voltage distribution PV1 may represent the threshold voltage distribution of memory cells whose stored data is "01." The threshold voltage distribution PV2 may represent the threshold voltage distribution of memory cells whose stored data is "00." The threshold voltage distribution PV3 may represent the threshold voltage distribution of memory cells whose stored data is "10."

Before degradation of memory cells occurs, the threshold voltage distributions PV0, PV1, PV2 and PV3 may be identified by the first read voltage RV1, the second read voltage RV2 and the third read voltage RV3.

After degradation of the memory cells occurs, portions of the threshold voltage distributions PV0, PV1, PV2 and PV3 may overlap.

As a result, read operations using the preset read voltages RV1, RV2 and RV3 may fail, and determination of new optimal read voltages for successful read operations may be required.

Referring to FIG. 5, a first read operation using two or more peak read voltages PRV1, PRV2 and PRV3 may be performed.

The first read operation may be performed when read operations with the preset read voltages RV1, RV2 and RV3 fail. Alternatively, the first read operation may be performed after read operations using a history read voltage, a read retry voltage and so forth are tried after read operations with the preset read voltages RV1, RV2 and RV3 fail.

According to the first read operation using the peak read voltages PRV1, PRV2 and PRV3, a least significant bit (LSB) read pattern may be obtained. Also, according to the first read operation, a most significant bit (MSB) read pattern may be obtained.

A read pattern obtained according to the first read operation may be stored and managed in the buffer memory 300.

Since the peak read voltages PRV1, PRV2 and PRV3 according to the first read operation are used in a read operation for determining an optimal read voltage, decoding of data obtained by the first read operation by the peak read voltages PRV1, PRV2 and PRV3 may not be performed.

Gaussian read voltages GM1, GM2 and GM3 may be determined using the peak read voltages PRV1, PRV2 and PRV3 according to the first read operation. The Gaussian read voltages GM1, GM2 and GM3 may be the aforementioned first optimal read voltages.

A read operation by the Gaussian read voltages GM1, GM2 and GM3 may be performed.

When the read operation using the Gaussian read voltages GM1, GM2 and GM3 succeeds, the read pattern stored in the buffer memory 300 may be deleted.

When the read operation by the Gaussian read voltages GM1, GM2 and GM3 fails, an operation for determining a new optimal read voltage may be performed. In this case, the read pattern stored in the buffer memory 300 may be maintained.

Referring to FIG. 6, a second read operation by at least two candidate read voltages may be performed.

The second read operation may mean any one of read operations for determining a new optimal read voltage after the read operation by the first optimal read voltage determined according to the first read operation fails. The second read operation may mean a read operation that is performed immediately after the first read operation or may mean a read operation that is performed second, third or the like after the first read operation.

For example, read operations by two or more candidate read voltages CRV11, CRV12, CRV13, CRV14 and CRV15 included in a first group may be sequentially performed. Read operations by two or more candidate read voltages CRV21, CRV22, CRV23, CRV24 and CRV25 included in a second group may be performed.

A change in the number of turned-on memory cells may be obtained in a process in which read operations by candidate read voltages are sequentially performed. For example, when the number of turned-on memory cells decreases and then increases, a final candidate read voltage may be determined on the basis of a candidate read voltage, with which a corresponding read operation is performed.

For example, when the number of turned-on memory cells decreases and then increases, a candidate read voltage used to perform a read operation at a corresponding time point may be determined as the final candidate read voltage. Alternatively, when the number of turned-on memory cells decreases and then increases, a candidate read voltage with which a read operation is performed at a previous time point may be determined as the final candidate read voltage. Alternatively, an average value of the candidate read voltage of the corresponding time point and the candidate read voltage of the previous time point may be determined as the final candidate read voltage.

The final candidate read voltage may be a second optimal read voltage.

A final candidate read voltage of the first group may be determined according to the read operations by the candidate read voltages CRV11, CRV12, CRV13, CRV14 and CRV15 of the first group. A final candidate read voltage of the second group may be determined according to the read operations by the candidate read voltages CRV21, CRV22, CRV23, CRV24 and CRV25 of the second group.

In order to identify the final candidate read voltage of the first group and the final candidate read voltage of the second group, the read pattern stored in the buffer memory 300 may be used.

The final candidate read voltage of the first group may correspond to "11" of the read pattern. The final candidate read voltage of the second group may correspond to "00" of the read pattern.

It may be recognized that 1 and 0 are identified by the final candidate read voltage of the first group and 0 and 1 are identified by the final candidate read voltage of the second group.

In this way, since a final candidate read voltage obtained during performing the second read operation is identified using the read pattern obtained during performing the first read operation, a separate read operation is not necessary to identify the final candidate read voltage. Consequently, an operation for determining a new optimal read voltage may be performed while reducing the number of read operations.

When the final candidate read voltage is determined, a read operation using the final candidate read voltage may be performed.

When the read operation using the final candidate read voltage succeeds, the read pattern stored in the buffer memory 300 may be deleted.

When the read operation by the final candidate read voltage fails, the read pattern stored in the buffer memory 300 may be maintained. A read operation for determining a new optimal read voltage may be performed after the second read operation, and the read pattern stored in the buffer memory 300 may be used in the process of determining a read voltage through the corresponding read operation.

The read pattern obtained through the first read operation may be stored and managed in the buffer memory 300 until a read operation is finally terminated according to the success or failure of the read operation. In the process of determining a new optimal read voltage after the first read operation, the read pattern may be used, so that an operation for determining an optimal read voltage may be performed while reducing the number of read operations. Efficiency of the read operation may be improved.

The number of read operations reduced according to the use of the read pattern may be greater when memory cells are triple-level cells or quad-level cells.

Figure 7:
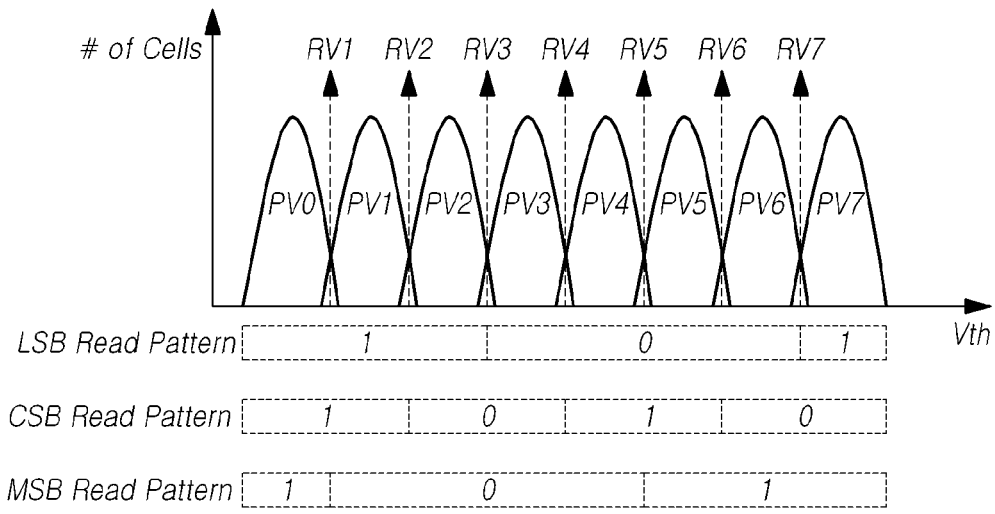
FIGS. 7 to 9 are diagrams illustrating an example in which read operations are performed when memory cells of a memory included in a storage device are triple-level cells, according to an embodiment of the present disclosure.
Figure 8:
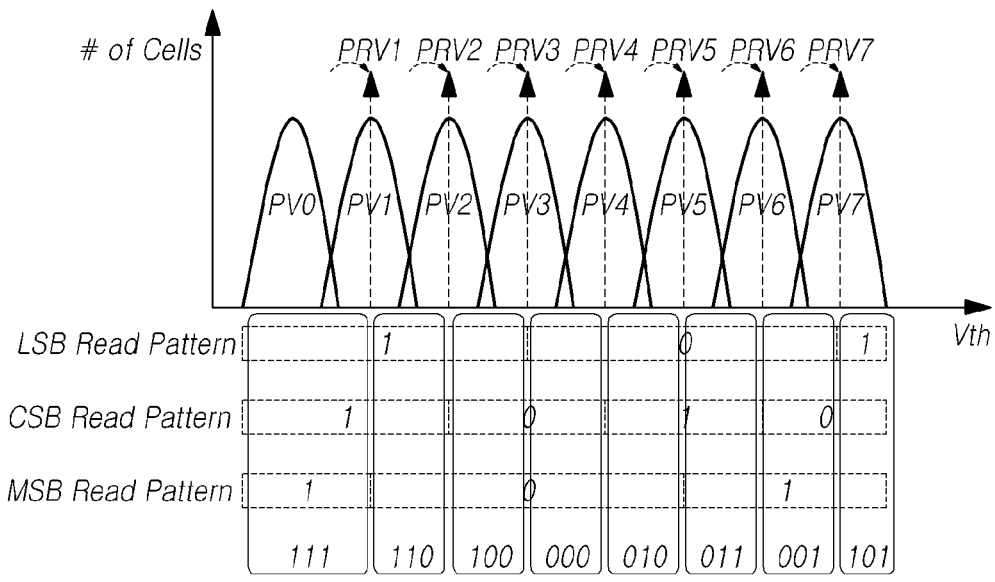
Figure 9:
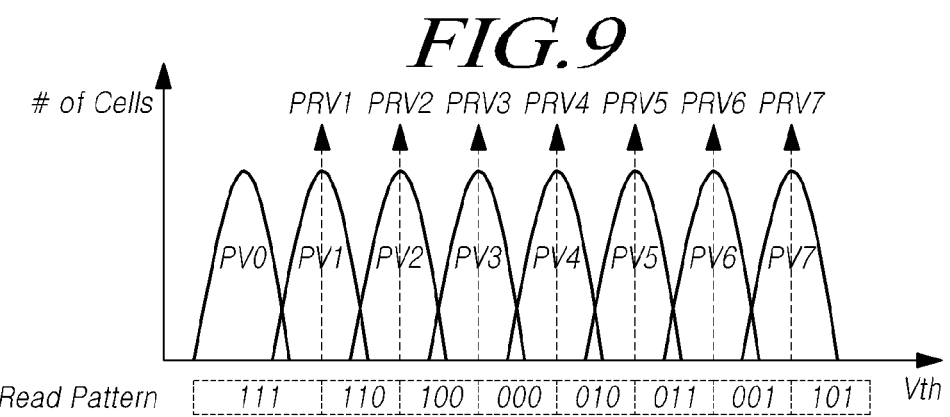
Figure 9:
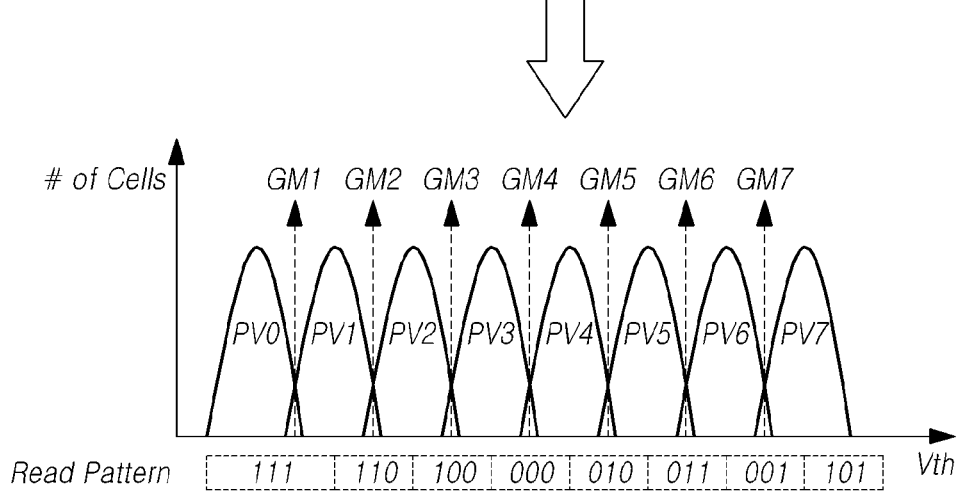
Figure 9:
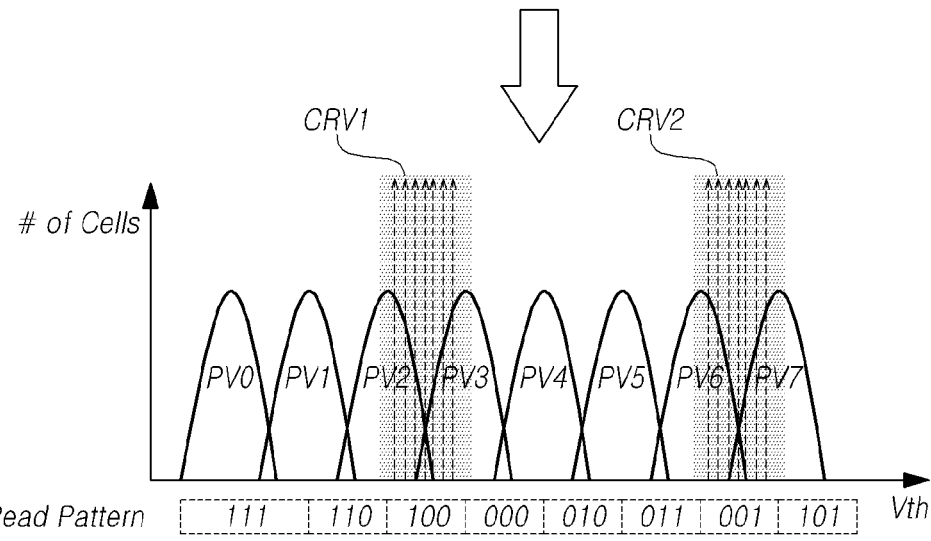

FIGS. 7 to 9 are diagrams illustrating an example in which read operations are performed when memory cells of a memory included in a storage device are triple-level cells, according to an embodiment of the present disclosure.

FIGS. 7 and 8 illustrate an example of a read operation performed according to a first read operation when memory cells are triple-level cells.

When memory cells are triple-level cells, since 3-bit data may be stored in each memory cell, eight threshold voltage distributions PV0 to PV7 of memory cells may be identified.

For example, the threshold voltage distribution PV0 may represent the threshold voltage distribution of memory cells whose stored data is "111." The threshold voltage distributions PV1, PV2, PV3, PV4, PV5, PV6 and PV7 may represent the threshold voltage distributions of memory cells whose stored data are "110," "100," "000," "010," "011," "001" and "101," respectively.

In the first read operation, a read operation for obtaining a read pattern may be performed using two or more read voltages.

For example, a read operation for obtaining a least significant bit (LSB) read pattern may be performed. Also, a read operation for obtaining a middle bit (CSB) read pattern may be performed. In addition, a read operation for obtaining a most significant bit (MSB) read pattern may be performed.

According to the type of memory cells, read operations for obtaining at least two middle bit read patterns may be performed.

FIG. 7 shows an example in which a read pattern is obtained according to preset read voltages RV1 to RV7. FIG.

8 shows an example in which a read pattern is obtained according to peak read voltages PRV1 to PRV7 for obtaining Gaussian read voltages.

Depending on the case, a read pattern may be obtained in a process for determining a new optimal read voltage as in the example shown in FIG. 8, or may be obtained in the process of performing the read operation by the preset read voltages RV1 to RV7 as in the example shown in FIG. 7.

As in the examples shown in FIGS. 7 and 8, at least two read patterns may be obtained according to the read operations by the preset read voltages RV1 to RV7 and the peak read voltages PRV1 to PRV7, and may be stored in the buffer memory 300.

Since read operations using the preset read voltages RV1 to RV7 or the peak read voltages PRV1 to PRV7 are used for determining a new optimal read voltage, decoding of data obtained through the corresponding read operation may not be performed.

Referring to FIG. 9, in a first read operation, a read operation using peak read voltages PRV1 to PRV7 may be performed, and a read pattern may be obtained. The read pattern may be obtained in the process of reading, for example, a least significant bit read page, a middle bit read page and a most significant bit read page.

The obtained read pattern may be stored in the buffer memory 300.

An optimal read voltage may be determined according to the first read operation. For example, Gaussian read voltages GM1 to GM7 corresponding to a first optimal read voltage may be determined.

A read operation by the Gaussian read voltages GM1 to GM7 may be performed.

When the read operation by the Gaussian read voltages GM1 to GM7 succeeds, the read pattern stored in the buffer memory 300 may be deleted.

When the read operation by the Gaussian read voltages GM1 to GM7 fails, a second read operation for determining a new optimal read voltage may be performed.

In the second read operation, for example, read operations using two or more candidate read voltages CRV1 of a first group and two or more candidate read voltages CRV2 of a second group may be sequentially performed.

A final candidate read voltage of the first group may be determined on the basis of the two or more candidate read voltages CRV1 of the first group. A final candidate read voltage of the second group may be determined on the basis of the two or more candidate read voltages CRV2 of the second group.

The final candidate read voltage of the first group and the final candidate read voltage of the second group may be identified using the read pattern stored in the buffer memory 300. For example, the final candidate read voltage of the first group may be identified as corresponding to "100." The final candidate read voltage of the second group may be identified as corresponding to "001."

A read operation using a separate read voltage may not be required to identify the final candidate read voltage of the first group and the final candidate read voltage of the second group.

An operation for determining a new optimal read voltage may be performed while reducing the number of read operations.

When a read operation by a final candidate read voltage determined by the second read operation fails, a read operation for determining a new optimal read voltage may be performed. The read pattern stored in the buffer memory 300 may be maintained without being deleted, and may be used to determine a new optimal read voltage in the read operation.

The read pattern stored in the buffer memory 300 may be maintained until the read operation by the corresponding read operation is terminated as a success or failure, and may be used to identify a newly determined optimal read voltage.

Efficiency of a read operation for determining a new optimal read voltage may be improved.

Figure 10:
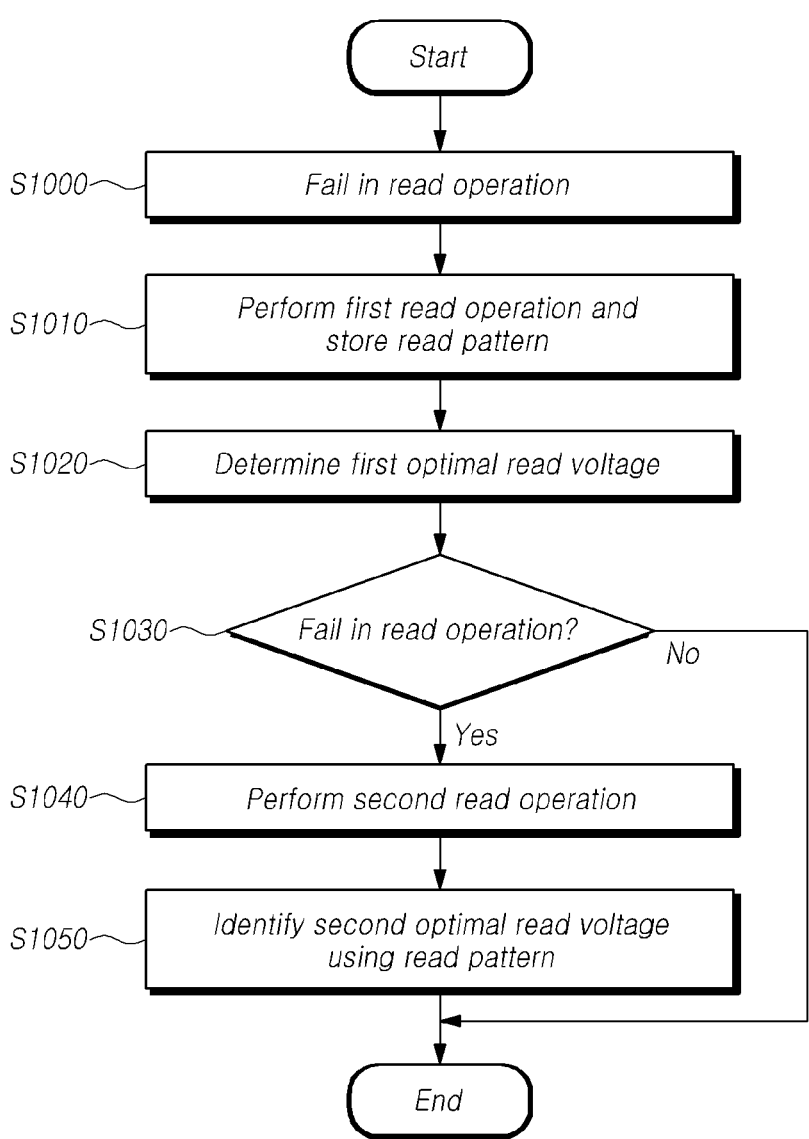
FIG. 10 is a diagram illustrating an example of a method for operating a storage device according to an embodiment of the present disclosure.

FIG. 10 is a diagram illustrating an example of a method for operating a storage device according to an embodiment of the present disclosure.

Referring to FIG. 10, a storage device 100 may fail in a read operation that is initially performed (S1000).

The read operation that is initially performed may mean a read operation using a preset read voltage. The read operation that is initially performed may include at least one read operation (e.g., a read operation according to a history read voltage, a read operation according to a read retry voltage, etc.) performed after the read operation by the preset read voltage fails.

When the read operation fails, the storage device 100 may perform a first read operation for determining a new optimal read voltage, and may store a read pattern obtained through the first read operation (S1010).

The first read operation may be an operation of reading at least a portion of a least significant bit read page, a middle bit read page or a most significant bit read page. Decoding of data obtained through the first read operation may not be performed.

The storage device 100 may determine a first optimal read voltage through the first read operation (S1020).

The storage device 100 may perform a read operation using the first optimal read voltage.

When the read operation using the first optimal read voltage fails (S1030), the storage device 100 may perform a second read operation for determining a new optimal read voltage (S1040).

The storage device 100 may determine a new second optimal read voltage through the second read operation, and may identify the second optimal read voltage using the stored read pattern (S1050), without performing a separate read operation for identifying the second optimal read voltage.

When the read operation by the first optimal read voltage or a read operation by the second optimal read voltage succeeds, the storage device 100 may delete the stored read pattern.

When the read operation by the second optimal read voltage fails, the storage device 100 may maintain the stored read pattern, and may use the read pattern in the process of determining a new optimal read voltage in a read operation to be subsequently performed.

Through the embodiments of the disclosed technology, since a previously obtained read pattern is stored and is used in the process of determining a new optimal read voltage according to failure of a read operation, the number of read operations may be reduced. An operation of determining a new optimal read voltage may be performed while efficiency of a read operation is improved.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A storage device comprising:
a memory including a plurality of memory cells; and
a controller configured to determine at least two first optimal read voltages by performing a first read operation on at least a part of the plurality of memory cells, to store at least two read patterns obtained in a process of reading at least two bit read pages of the memory through the first read operation, and to identify at least two second optimal read voltages obtained through a second read operation different from the first read operation, by using the at least two read patterns.

2. The storage device according to claim 1, wherein the at least two read patterns include a least significant bit read pattern and a most significant bit read pattern.

3. The storage device according to claim 1, wherein the at least two read patterns include a least significant bit read pattern, a most significant bit read pattern and at least one middle bit read pattern.

4. The storage device according to claim 1, wherein the at least two first optimal read voltages are determined on the basis of at least two peak read voltages corresponding to peaks of threshold voltage distributions of at least parts of the plurality of memory cells.

5. The storage device according to claim 1, wherein, in the first read operation, decoding of a value stored in at least one of the plurality of memory cells and obtained through the first read operation is not performed.

6. The storage device according to claim 1, wherein the at least two second optimal read voltages are determined through the second read operation performed using at least two candidate read voltages adjacent to the at least two first optimal read voltages and separated according to a preset offset.

7. The storage device according to claim 6, wherein, when performing the second read operation, a read operation using a read voltage other than the at least two candidate read voltages is not performed.

8. The storage device according to claim 1, wherein the second read operation is performed when a read operation using the at least two first optimal read voltages fails.

9. The storage device according to claim 1, wherein at least one initial read operation is performed before the first read operation.

10. The storage device according to claim 1, further comprising:
a buffer memory located inside or outside the controller, and configured to store the at least two read patterns.

11. The storage device according to claim 10, wherein the at least two read patterns are deleted from the buffer memory when a read operation using the at least two second optimal read voltages succeeds.

12. The storage device according to claim 10, wherein the at least two read patterns are maintained in the buffer memory when a read operation using the at least two second optimal read voltages fails.

13. A method for operating a storage device, comprising:
determining at least two first optimal read voltages for at least a part of a plurality of memory cells by performing a first read operation;
storing at least two read patterns obtained in a process of reading at least two bit read pages of a memory through the first read operation;
determining at least two second optimal read voltages by performing a second read operation different from the first read operation; and
identifying the at least two second optimal read voltages using the at least two read patterns.

14. The method according to claim 13, further comprising:
performing a read operation using the at least two second optimal read voltages; and
deleting the at least two read patterns when the read operation succeeds.

15. A controller comprising:
a buffer memory; and
a processor configured to determine at least two first optimal read voltages by performing a first read operation, to store at least two read patterns obtained in a process of reading at least two bit read pages of a memory through the first read operation in the buffer memory, and to identify at least two second optimal read voltages determined through a second read operation different from the first read operation, by using the at least two read patterns.

16. The controller according to claim 15, wherein the at least two read patterns stored in the buffer memory are deleted when a read operation using the at least two second optimal read voltages succeeds.

17. The controller according to claim 15, wherein the at least two read patterns are maintained in the buffer memory until a read operation using the at least two second optimal read voltages or an additional read voltage obtained after the at least two second optimal read voltages are determined succeeds.

18. The controller according to claim 15, wherein the second read operation is performed when a read operation using the at least two first optimal read voltages fails.

* * * * *